US008441369B2

(12) United States Patent
Park et al.

(10) Patent No.: US 8,441,369 B2
(45) Date of Patent: May 14, 2013

(54) REMOTE USER INTERFACE SYSTEM AND METHOD

(75) Inventors: Ho Yeon Park, Seoul (KR); Young Sin Ryu, Seongnam-si (KR); Jae Yeon Song, Seoul (KR); Bo Sun Jung, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 550 days.

(21) Appl. No.: 12/712,796

(22) Filed: Feb. 25, 2010

(65) Prior Publication Data

US 2010/0219976 A1 Sep. 2, 2010

(30) Foreign Application Priority Data

Feb. 27, 2009 (KR) ........................ 10-2009-0016935
Apr. 24, 2009 (KR) ........................ 10-2009-0035776

(51) Int. Cl.

| | |
|---|---|
| ***G08B 5/00*** | (2006.01) |
| ***B60R 25/10*** | (2006.01) |
| ***G09B 21/00*** | (2006.01) |
| ***G05B 11/01*** | (2006.01) |
| ***H03M 11/00*** | (2006.01) |
| ***G08C 19/12*** | (2006.01) |

(52) U.S. Cl.
USPC .............. 340/815.6; 340/426.13; 340/539.14; 340/4.11; 340/12.22; 340/4.61; 725/109; 348/734; 341/22; 341/173; 341/176; 715/765

(58) Field of Classification Search ........................ None
See application file for complete search history.

(56) References Cited

U.S. PATENT DOCUMENTS

| | | | | |
|---|---|---|---|---|
| 8,191,100 | B2 * | 5/2012 | Lindquist et al. | 725/110 |
| 8,196,163 | B2 * | 6/2012 | Foti | 725/32 |
| 8,225,348 | B2 * | 7/2012 | Morris et al. | 725/37 |
| 8,230,012 | B2 * | 7/2012 | Abiezzi et al. | 709/204 |
| 2002/0143629 | A1 * | 10/2002 | Mineyama et al. | 705/14 |
| 2004/0224723 | A1 * | 11/2004 | Farcasiu | 455/557 |
| 2008/0070626 | A1 | 3/2008 | Song | |
| 2008/0205419 | A1 * | 8/2008 | Shin et al. | 370/401 |
| 2008/0250151 | A1 | 10/2008 | Tomita | |
| 2009/0225760 | A1 * | 9/2009 | Foti | 370/400 |
| 2009/0307736 | A1 * | 12/2009 | Lindquist et al. | 725/110 |

OTHER PUBLICATIONS

Shahriyar et al., "Remote Controlling of Home Appliances using Mobile Telephony", International Journal of Smart Home, vol. 2, No. 3, Jul. 2008.

Matsubara et al., "DTV Architecture Design for Multimedia Network Environments", IEEE Transactions on Consumer Electronics, vol. 51, No. 1, Feb. 2005.

* cited by examiner

*Primary Examiner* — Jennifer Mehmood
*Assistant Examiner* — Fekadeselassie Girma
(74) *Attorney, Agent, or Firm* — The Farrell Law Firm, P.C.

(57) ABSTRACT

A remote user interface system and method for effectively controlling functions of a client device and remote user interface rendered on the client device by means of a client-specific or content-specific control user interface rendered on a remote control device is provided. A method for controlling a remote user interface device with a remote control device includes broadcasting, at the remote control device, a discovery message for discovering the remote user interface device; performing, when a response is received, a capability exchange and matching with the remote user interface device; rendering a control user interface transmitted by the remote user interface device and displaying the rendered control user interface on a screen; and transmitting, when an input is detected on the control user interface, a control command corresponding to the input to the remote user interface device.

9 Claims, 15 Drawing Sheets

REMOTE USER INTERFACE SYSTEM AND METHOD

PRIORITY

This application claims priority under 35 U.S.C. §119(a) to Korean Patent Application No. 10-2009-0016935, filed on Feb. 27, 2009 and Korean Patent Application No. 10-2009-0035776, filed on Apr. 24, 2009, the contents of which are incorporated herein by reference.

BACKGROUND OF THE INVENTION

1. Field of the Invention

The present invention relates, in general, to remote user interfaces and, in particular, to a remote user interface system and method for effectively controlling a client device and remote user interface rendered on the client device by means of a client-specific or content-specific control user interface rendered on a remote control device.

2. Description of the Related Art

Several industrial standardization organizations such as Digital Living Network Alliance (DLNA), Home Audio-Video Interoperability (HAVi), and Universal Plug and Play (UPnP) are conducting research on enhanced home network technology.

Remote User Interface (RUI) technology is a promising technology for enhancing the operability of a home network. Typically, the RUI technology is implemented using the client-server architecture in which an RUI client downloads a User Interface (UI) from an RUI server such that a user can control the RUI client by means of the UI on the RUI client.

FIG. 1 is a diagram illustrating an RUI-enabled home network in which an RUI Server (RUIS) 100 provides an RUI Client (RUIC) 101 with the RUI and control information and a user controls the RUIC 101 by navigating onto the RUI using a remote controller 102.

In order to remotely control the RUIC 101, the user is required to know the functions associated with the keys of the remote controller 102 and how the RUI rendered on the RUIC 101 responds to the keys of the remote controller 102. Thus, the user can use the remote controller 102 only for controlling the known functions and devices.

Such a conventional RUI method has a drawback in that the remote controller 102 must have a large number of keys for the user to control the various functions of the RUIC 101. Further, if a new function is added to the RUIS 100 or the RUIC 101, remote control of the newly added function either becomes impossible or a key which previously controlled another function would now need to control the new function. Furthermore, the conventional RUI method is limited in extending the functionality of the remote controller and is limited by its user-specific configuration.

SUMMARY OF THE INVENTION

In order to overcome the problems in the prior art, the present invention provides a remote user interface system and method that is capable of controlling a client device rendering multiple user interfaces effectively by using a remote control device such as a mobile phone or other portable device.

In an aspect of the present invention, a method for controlling a remote user interface device with a remote control device includes broadcasting, at the remote control device, a discovery message for discovering the remote user interface device; performing, when a response is received, a capability exchange and matching with the remote user interface device; rendering a control user interface transmitted by the remote user interface device and displaying the rendered control user on a screen; and transmitting, when an input is detected on the control user interface, a control command corresponding to the input to the remote user interface device.

In another aspect of the present invention, a method for controlling a remote user interface device with a remote control device includes transmitting, after a discovery message transmitted by the remote control device is received, a response message from the remote user interface device to the remote control device; performing capability exchange and matching between the remote user interface device and the remote control device for delivering a control user interface; acquiring, at the remote user interface device, content selected by the remote control device and a control user interface corresponding to the selected content; transmitting the control user interface from the remote user interface device to the remote control device; and controlling, at the remote user interface device, playback of the selected content according to a remote control command transmitted by the remote control device.

In another aspect of the present invention, a method for controlling a remote user interface device includes receiving content selected by a user and a control user interface corresponding to the content from an Internet Protocol Television (IPTV) applications entity; rendering the content and the control user interface; displaying the content on a display screen; transmitting the control user interface to a remote control device; display, at the remote control device, the control user interface on a control screen; detecting, at the remote control device, an input occurred on the control user interface; transmitting the a control command corresponding to the input from the remote control device to the remote user interface device; and executing, at the remote user interface device, the control command to control the playback of the content on the display screen.

In another aspect of the present invention, a system for controlling a remote user interface device includes an Internet Protocol Television (IPTV) applications entity which provides content and control user interface corresponding to the contents; a remote user interface device which renders the contents and control user interfaces, distributes the control user interfaces, and controls display of the contents according to a remote control command; and a remote control device which displays the control user interface received from the remote user interface device and transmits the remote control command generated in response to user input occurred on the control user interface to the remote user interface device.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF THE PRESENT INVENTION

Figure 1:
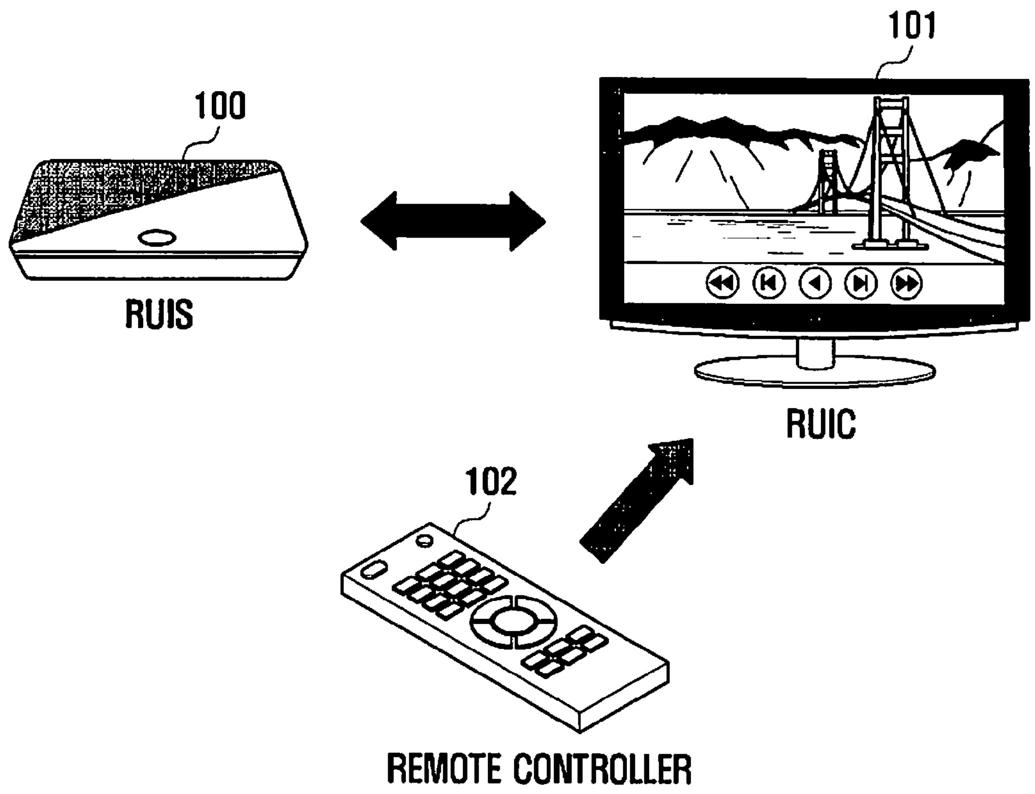
FIG . 1 (PRIOR ART)
FIG. 1 illustrates an RUI-enabled home network in which an RUI Server (RUIS) provides an RUI Client (RUIC) with the RUI and control information, and a user controls the RUIC by navigating on RUI using a remote controller.

Embodiments of the present invention are described with reference to the accompanying drawings in detail. The same reference numbers are used throughout the drawings to refer to the same or like parts. The described features and advantages of the invention may be combined in any suitable manner in one or more embodiments and one skilled in the art would recognize that the invention may be practiced without one or more of the specific features or advantages of a particular embodiment. Detailed descriptions of well-known functions and structures incorporated herein may be omitted to avoid obscuring the subject matter of the present invention.

In the following description, the term "RUIS" denotes a device providing another device with a Remote User Interface (RUI) in a client-server architecture system. The terms "Remote User Interface Server", "RUIS", and "IPTV applications" are used synonymously. In the following description, the term "RUIC" is a device which receives the RUI from the RUIS and renders the RUI on a display screen. The terms "Remote User Interface Client", "RUIC", "remote UI device", and "OITF terminal" are used synonymously. In the following description, the term "third device" denotes a remote control RUIC device which controls the RUIC by means of the UI provided by the RUIC or the RUIS. The third device can be a mobile device, e.g. mobile phone and other handheld devices having wireless communication capability. The terms "third device", "third RUIC", "remote device", "remote control device", and "mobile device" are used synonymously. "UICP" denotes a User Interface Control Point, which sets up the connection between a compatible RUIS and an RUIC.

In an embodiment of the present invention, a method and system are provided for the user to interact with the RUIC by means of multiple RUIs rendered thereon using a third device such as a mobile phone or portable device.

A method for the third device to discover the RUIS and RUIC devices, perform capability matching with the RUIS and RUIC device via appropriate control UI, receive the control UI from the RUIS and RUIC devices, and control the RUIC device with the control UI is also described.

In another embodiment of the present invention, a third device (RUI device such as a mobile phone) having a display provides the user with user-specific UI control information or a personalized UI such that the user controls the RUIC with respect to the control information. Here, providing the user-specific UI control information can be interpreted in multiple ways. The user-specific UI control information may include only the information related to the control of the RUI rendered currently in the RUIC or the control information personalized for controlling individual third devices owned by the user. The third device can be configured to receive the manufacturer-specific control information provided by the individual device manufacturers of the RUIS and RUIC devices.

As mentioned, the Remote User Interface (RUI) system can include a remote UI device, a remote control device, and IPTV applications.

Here, the remote control device can control the following operations of the remote UI device: transmission of a discovery message for discovering remote UI devices, capability exchange and matching with the found remote UI device, rendering and displaying the control UI received from the remote UI device, and transmission of the remote control command in response to a selection on the control UI. Receiving the control UI from the remote UI device includes rendering a received control UI of a default menu of the remote UI device, requesting a transmission of the control UI of the content selected by the user, and rendering and displaying the control UI of the content. The control UI of the default menu is for selecting the default menu of an Open IPTV Terminal Function (OITF) device, and the control UI of the content is a control UI for playback of the corresponding content. The remote control device can be a mobile terminal, and the remote UI device can be an OITF device.

The mobile terminal includes an IRCF, the OITF device can include a Declarative Application Environment (DAE) and IRCF, and the remote UI device discovery process can be triggered by the IRCF of the mobile terminal and the IRCF-S of the OITF device. In case that the IRCF of the mobile terminal and the IRCF-S of the OITF device have UPnP Discovery functionality, the remote control device transmits a discovery message having a Search Target (ST) field containing the target information indicating search for the OITF terminal that can be controlled by the remote control device, and analyzes, upon receipt of a response message, the Device Description of the OITF device, and performs capability exchange and matching.

Here, the remote control device includes an IRCF and the remote UI device includes a DAE and an IRCF-S; displaying the control UI of the default menu at the remote control device; which includes receiving, at the IRCF, the default control UI from the IRCF-S of the OITF device and rendering and displaying the received default control UI; and the default control UI can be the control UI for selecting an RUI.

The remote control device includes the IRCF and the remote UI device including the DAE and IRCF-S; displaying, at the remote control device, the control UI received from the remote UI device includes requesting, when specific content is selected, the OITF device for the RUI of the selected content, transferring the request for the RUI of the selected content to the IPTV applications selected by the user via the IRCF-S and DAE of the OITF device, transferring the content received from the IPTV applications and the control UI of the content to the OITF device, receiving, at the IRCF of the mobile terminal, the control UI of the content transmitted by the OITF device, and rendering and displaying the control UI of the content on the screen.

In another embodiment of the present invention, the remote UI device can control display of the content under the control of the remote control device. The remote UI device transmits, upon receipt of a discovery message, a response message to the remote control device in response to the discovery message, performs capability exchange and matching process with the remote control device, receives the content selected by the remote control device and Control UI (CUI) for the content, transmits the CUI to the remote control device, and controls the playback of the content according to the remote control command received from the remote control device.

After performing the capability exchange and matching, the remote UI device transmits a default CUI to the remote control device such that the remote control device can select the content according to the user's intent.

Here, the remote UI device can be an OITF device, and transmitting the CUI from the remote UI device to the remote control device includes requesting, at the remote control device, an IPTV application for the CUI of the corresponding content, rendering the content and the corresponding CUI received from the IPTV application, displaying the rendered content and CUI on the screen, and transmitting the CUI from remote UI device to the remote control device. The OITF device includes the IRCF-S and DAE. The DAE renders the received content and the corresponding CUI and displays the content and the CUI on the screen, and the IRCF-S transmits the CUI to the remote control device.

In another embodiment of the present invention, a remote user interface control system includes IPTV applications, a remote UI device, and a remote control device. The IPTV application transmits the selected content and the content-specific CUI to the remote UI device. The remote UI device renders and displays the content and CUI on the screen and transmits the CUI to the remote control device. The remote control device displays the CUI received from the remote UI device and generates a remote control command input through the CUI. The remote UI device controls the processing of the content according to the remote control command transmitted by the remote control device.

Here, the CUI can be a UI for controlling the display of the content on the screen. In another embodiment of the present invention, a remote control device broadcasts a discovery message to discover remote UI devices, performs capability exchange and matching with a found remote UI device, and transmits a default CUI to the remote control device, and transmits, if a content is selected at the remote control device, a CUI to the remote control device.

In another embodiment of the present invention, a remote control interface system includes an IPTV application which provides selected content and a CUI corresponding to the content, a remote UI device which renders and displays the content and CUI provided by the IPTV application and controls the display of the content according to a remote control command, and a remote control device which displays the remote control UI, and transmits the remote control command generated in response to user input on the remote UI device.

Figure 2:
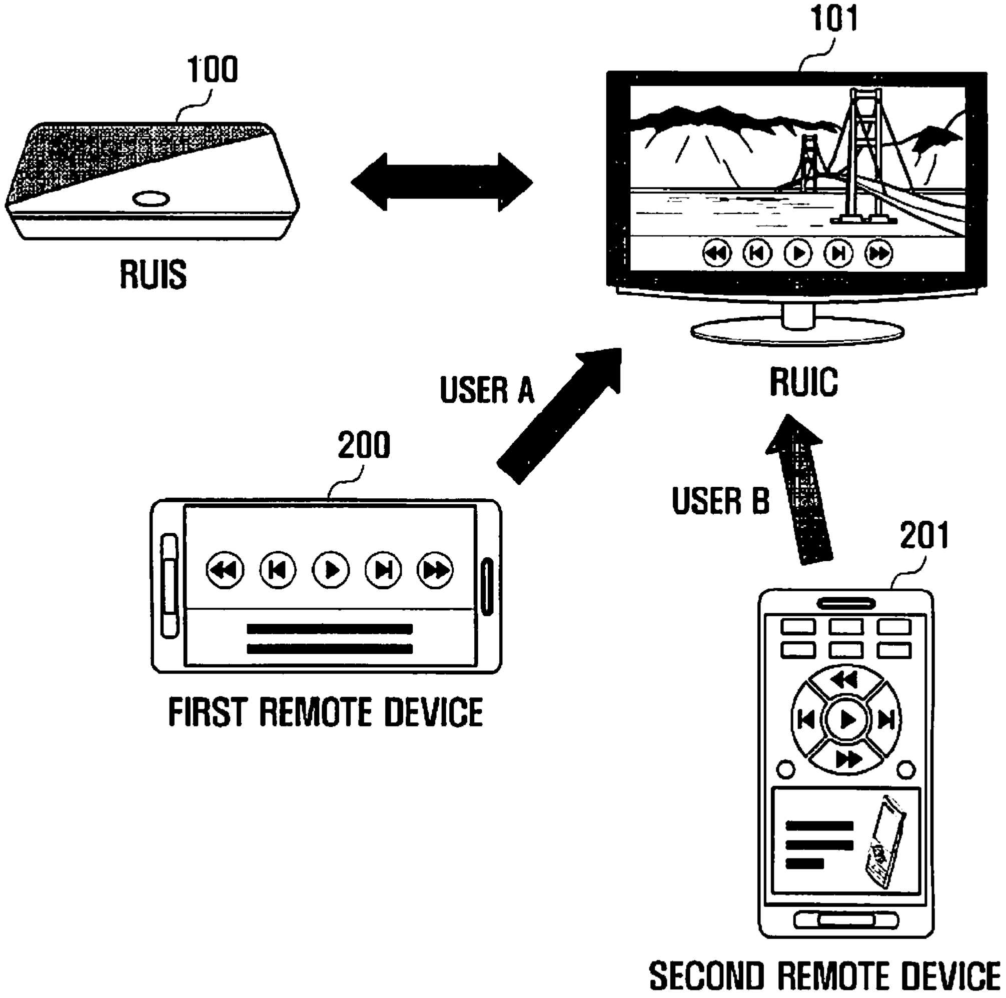
FIG. 2 illustrates a remote control interface system according to an embodiment of the present invention.

FIG. 2 is a diagram illustrating a remote control interface system according to another embodiment of the present invention.

As shown in FIG. 2, the remote control interface system includes an RUIS 100, an RUIC 101, a first RUI device 200, and a second RUI device 201.

Referring to FIG. 2, the RUIS 100 sends an RUI to the RUIC 101, and the RUIC 101 renders the RUI received from the RUIS 100 on its display screen. The first and second RUI devices 200 and 201 can control the RUIC 101 using a Control User Interface (CUI) provided by the RUIS 100 and/or the RUIC 101. The first and second RUI devices 200 and 201 can be customized by the user, and display only the control information related to the RUI rendered in the RUIC 101. The control information can be provided with other supplementary information. The user can control the RUIC 101 and/or the RUI rendered on the RUIC 101 by referencing the control information rendered on the RUI devices 200 and 201. Here, the first and second RUI devices 200 and 201 can be mobile terminals having a communication capability. The communication capability can be implemented with any cellular communication network schemes (such as Code Division Multiple Access (CDMA), Long Term Evolution (LTE), and Universal Mobile Telecommunications System (UMTS)), an Internet access network (such as a WiBro, WiMAX, and WiFi), and short range wireless communication network protocols (e.g., Bluetooth, ZigBee, and Ultra-wideband). The mobile terminal can be a mobile phone or a portable device having a display and supporting communication function.

Figure 3:
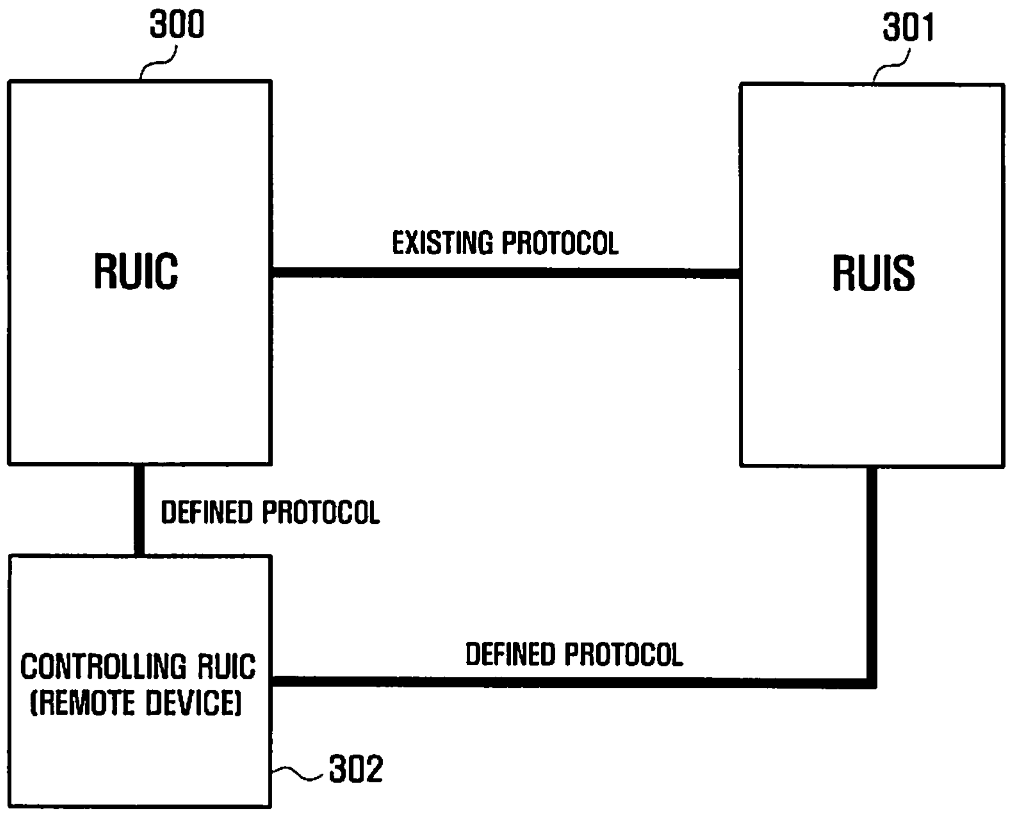
FIG. 3 illustrates a remote user interface system for controlling an RUIC by means of another RUIC according to an embodiment of the present invention.

FIG. 3 is a diagram illustrating a remote user interface system for controlling an RUIC by means of another RUIC according to an embodiment of the present invention.

As shown in FIG. 3, the remote user interface system includes a controlled RUIC 300, a RUIS 301, and a controlling RUIC 302.

The controlled RUIC 300 receives an RUI and control information from the RUIS 301 via a link established using a legacy (existing) protocol. The controlling RUIC 302 communicates with the controlled RUIC 300 using a protocol defined newly in an embodiment of the present invention.

The communication protocol between the controlling RUIC 302 and the controlled RUIC 300 and/or the RUIS 301 is defined by a typical behavior pattern as described in Table 1.

TABLE 1

| |
|---|
| 1. discovery |
| 2. capability matching |
| 3. transfer CUI |
| 4. control |

Referring to Table 1, the protocol includes a device discovery process by which the controlling RUIC 302 discovers the RUIS 301 and the controlled RUIC 300, a capability matching process for the controlling RUIC 302 to acquire an appropriate CUI by exchanging information, a CUI transfer process for the RUIS 301 or the controlled RUIC 300 transmits the CUI to the controlling RUIC 302, and a control process in which the controlling RUIC 302 renders the received CUI such that the user controls the controlled RUIC 300 by means of the CUI rendered on the controlling RUIC 302.

Figure 4:
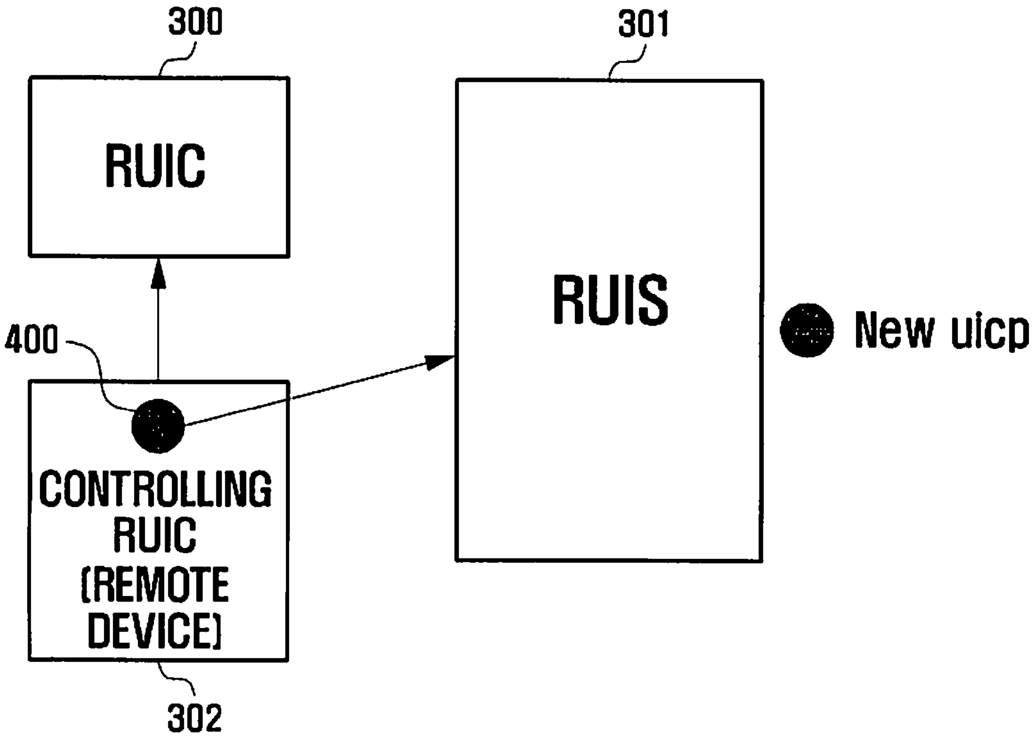
FIG. 4 illustrates operations of the RUIS and RUICs a device discovery process in the remote user interface system of FIG. 3.

FIG. 4 is a diagram illustrating operations of the RUIS and RUICs a device discovery process in the remote user interface system of FIG. 3.

In the above structured remote user interface system, the device discovery process can be implemented in two ways.

In the first approach, the controlling RUIC 302 discovers all available RUICs and RUISs and sorts out the controllable devices using the metadata. The metadata can be Device Descriptions or Capability Descriptions about the found devices, and the controlling RUIC 302 has the values for determining whether it can control the found devices. If a controllable RUIC is found, the controlling RUIC 302 performs the capability matching process to check whether the controlled RUIC can provide a CUI.

In the second approach, the controlling RUIC 302 broadcasts the discovery message with the information requesting for the RUICs and RUISs to fulfill a specific capability. For instance, the controlling RUIC 302 can transmit a UPnP Discovery message having the Search Target (ST) field containing target information indicating the capability required as a candidate. In this case, only the RUICs and RUISs fulfilling the requested capability respond to the Discovery message. The controlling RUIC 302 analyzes the Device Descriptions of the responded RUICs and RUISs and performs the capability matching process with the RUICs and RUISs which responded. As mentioned, the controlling RUIC 302 checks which RUIC and/or RUIS can provide the CUI in the capability matching process.

Figure 5:
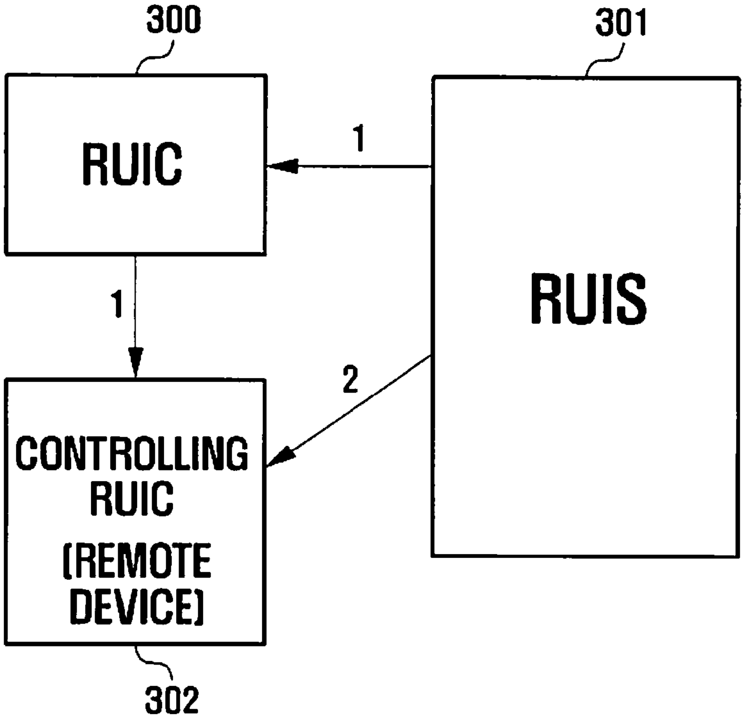
FIG. 5 illustrates operation of the RUIS and RUICs in a Control User Interface (CUI) transfer process for the remote user interface system according to an embodiment of the present invention.

FIG. 5 is a diagram illustrating operations of the RUIS and RUICs in a CUI transfer process for the remote user interface system according to an embodiment of the present invention.

The CUI can be transferred to the controlling RUIC 302 using two different methods. In the first method, the RUIS 301 transmits the information related to the CUI to the controlled RUIC 300, and the controlled RUIC 300 sends the CUI to the controlling RUIC 302 (the signal path denoted by reference numeral 1). In the second method, the RUIS 301 transmits the RUI to the controlling RUIC 302 directly without involvement of the controlled RUIC 300 (see the signal path denoted by reference numeral 2).

Figure 10:
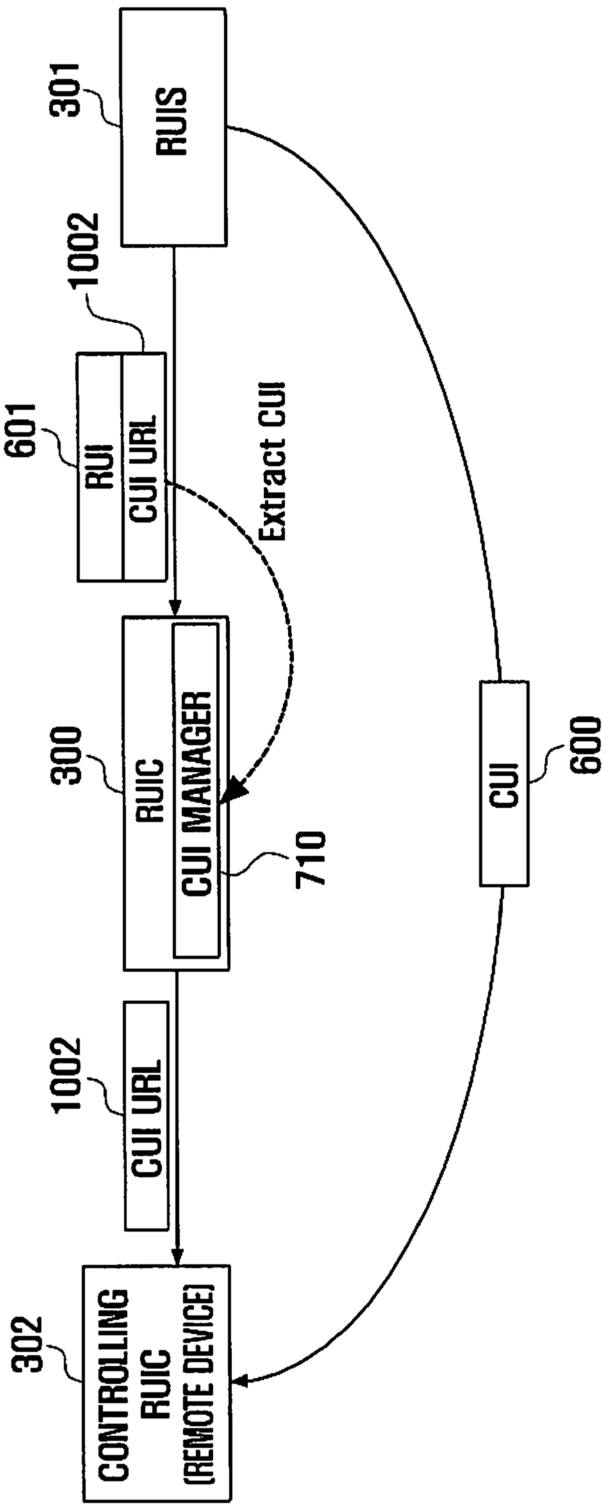
FIG. 10 illustrates a CUI transfer process in the remote user interface system according to another embodiment of the present invention.
Figure 11:
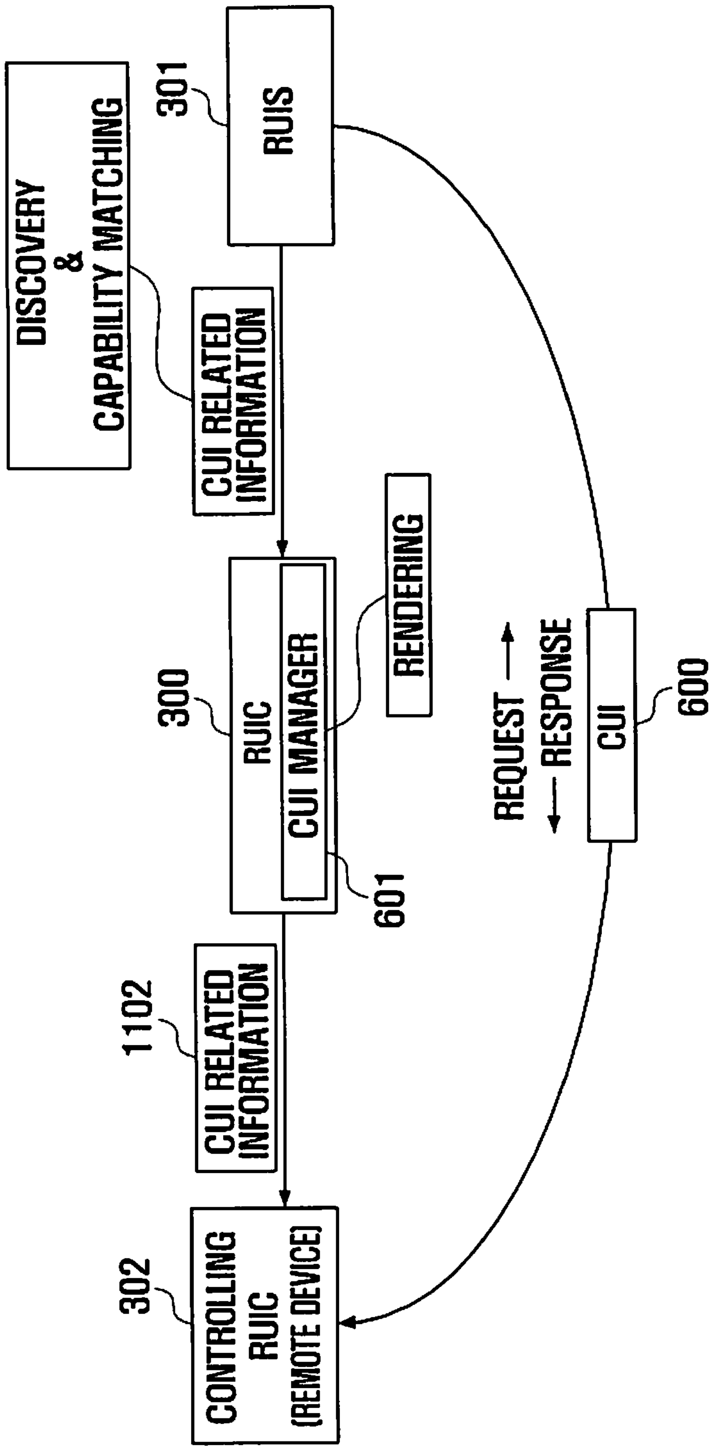
FIG. 11 illustrates a CUI transfer process in the remote user interface system according to another embodiment of the present invention.
Figure 12:
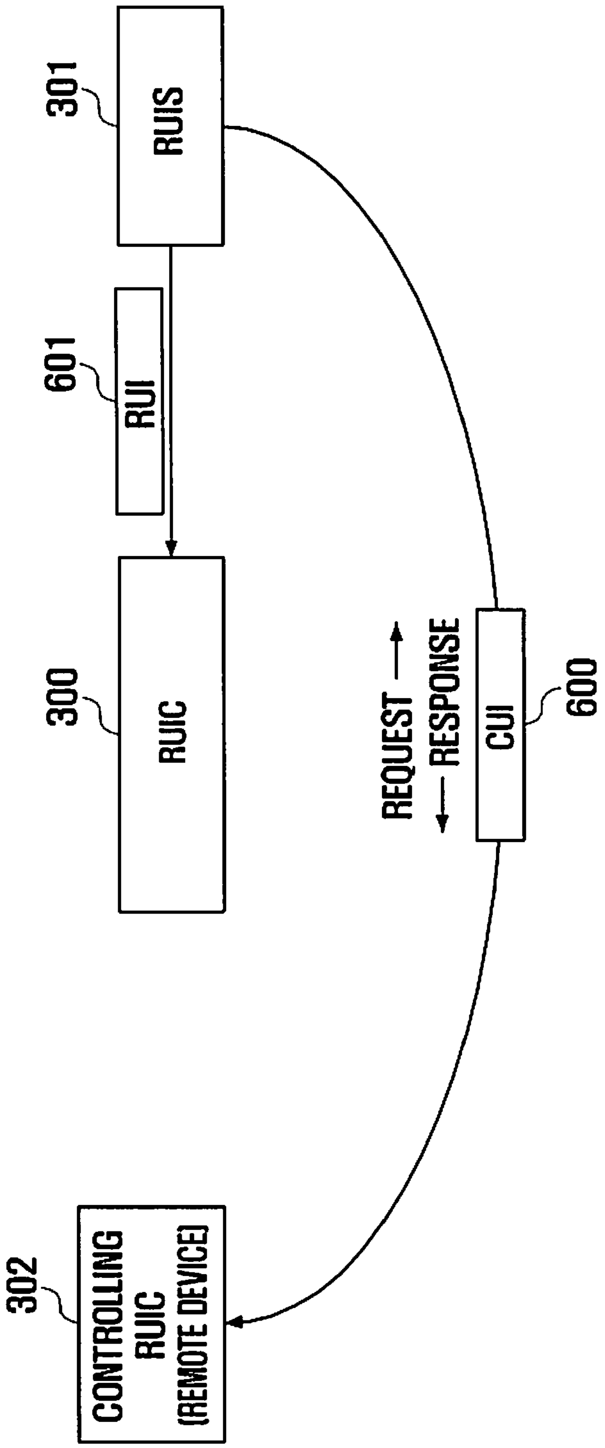
FIG. 12 illustrates a CUI transfer process in the remote user interface system according to another embodiment of the present invention.

The method for providing the controlling RUIC 302 with the CUI can be implemented in various manners. FIGS. 6 to 9 are diagrams illustrating methods for providing the controlling RUIC with the CUI via the controlled RUIC according to embodiments of the present invention. In the embodiments of FIGS. 6 to 9, the RUIS 301 transfers the CUI to the controlling RUIC 302 via the controlled RUIC 300 (see reference numeral 1 of FIG. 5). FIGS. 10 and 11 are diagrams illustrating methods for providing the controlling RUIC with the CUI directly without involvement of the controlled RUIC according to other embodiments of the present invention. In the embodiments of FIGS. 10 and 11, the controlling RUIC 302 receives the CUI information via the controlled RUIC 300 and the CUI from the RUIS 301 directly. That is, the CUI-related information flows in the direction of arrow 1 of FIG. 5, and the CUI flows in the direction of arrow 2 of FIG. 5. FIG. 12 is a diagram illustrating a method for providing the controlling RUIC with the CUI according to another embodiment of the present invention. In the embodiment of FIG. 12, the controlling RUIC 302 receives the CUI from the RUIS 301 directly. The CUI flows in the direction of arrow 2 of FIG. 5.

Figure 6:
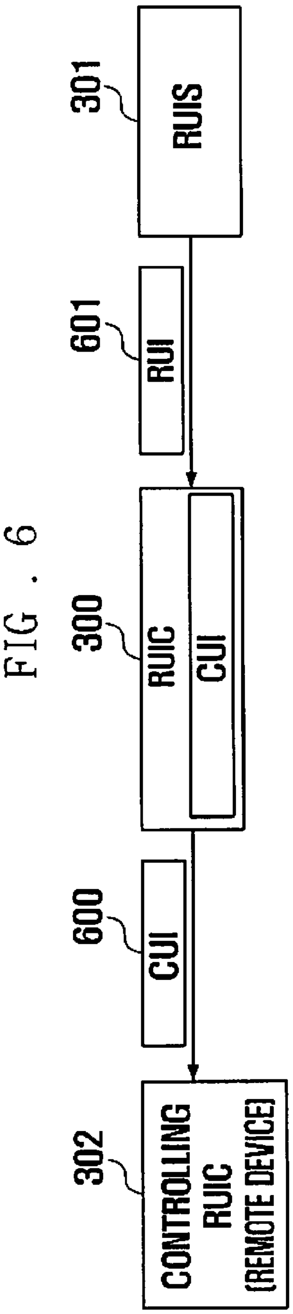
FIG. 6 illustrates a CUI transfer process in the remote user interface system according to an embodiment of the present invention.

FIG. 6 illustrates a CUI transfer process in the remote user interface system according to an embodiment of the present invention. In the embodiment of FIG. 6, the controlled RUIC 300 stores a default CUI and transfers the default CUI to the controlling RUIC 302.

Referring to FIG. 6, the controlled RUIC 300 has its own CUI 600. The RUIS 301 provides the controlled RUIC 300 with the RUI 601, and the controlled RUIC 300 provides the controlling RUIC 302 with the CUI 600. The CUI 600 stored in the controlled RUIC 300 includes unique control functions of the controlled RUIC 300 or the functions for controlling the RUI 601 provided by the RUIS 301.

Figure 7:
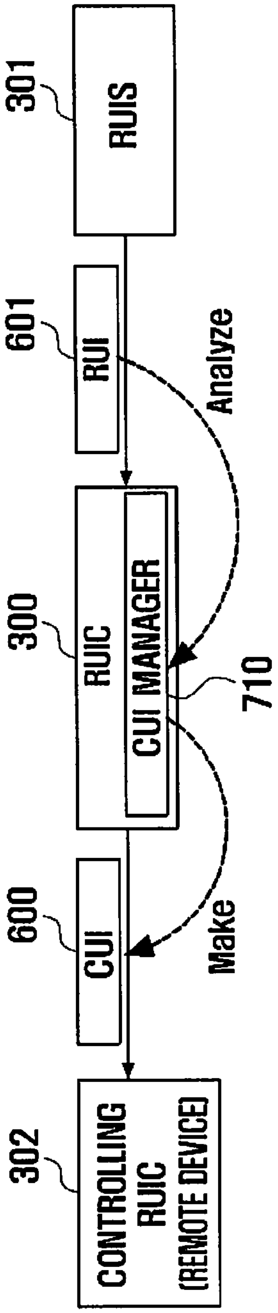
FIG. 7 illustrates a CUI transfer process in the remote user interface system according to another embodiment of the present invention.

FIG. 7 illustrates a CUI transfer process in the remote user interface system according to another embodiment of the present invention. In the embodiment of FIG. 7, the CUI manager 710 of the controlled RUIC 300 analyzes the RUI 601 provided by the RUIS 301 and configures the CUI 600 based on the analysis results.

Referring to FIG. 7, the controlled RUIC 300 is provided with the CUI manager 710. The CUI manager 710 is responsible for parsing the RUI 601 received from the RUIS 301 and generating the CUI 600 for controlling the RUI 601. That is, the CUI manager 710 extracts the control information elements for controlling the corresponding RUI 601 through the analysis process and produces the CUI 600 for controlling RUIC 302. The CUI 600 created by the CUI manager 710 is transferred to the controlling RUIC 302.

Figure 8:
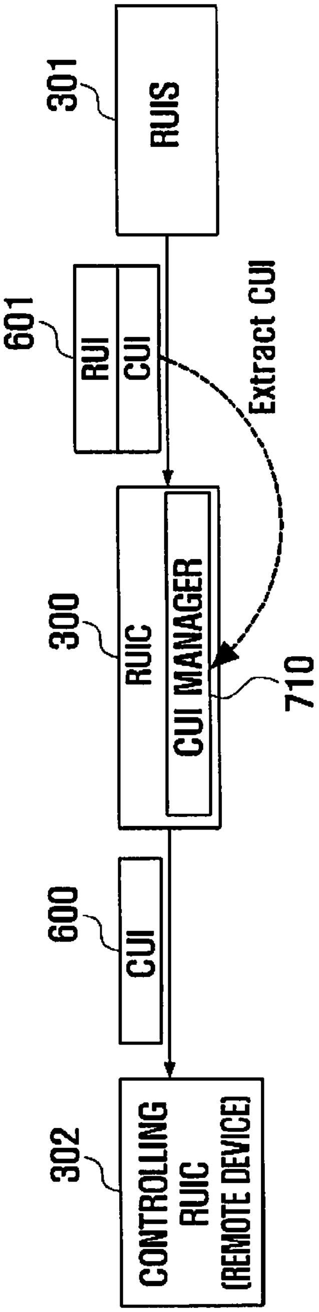
FIG. 8 illustrates a CUI transfer process in the remote user interface system according to another embodiment of the present invention.
Figure 9:
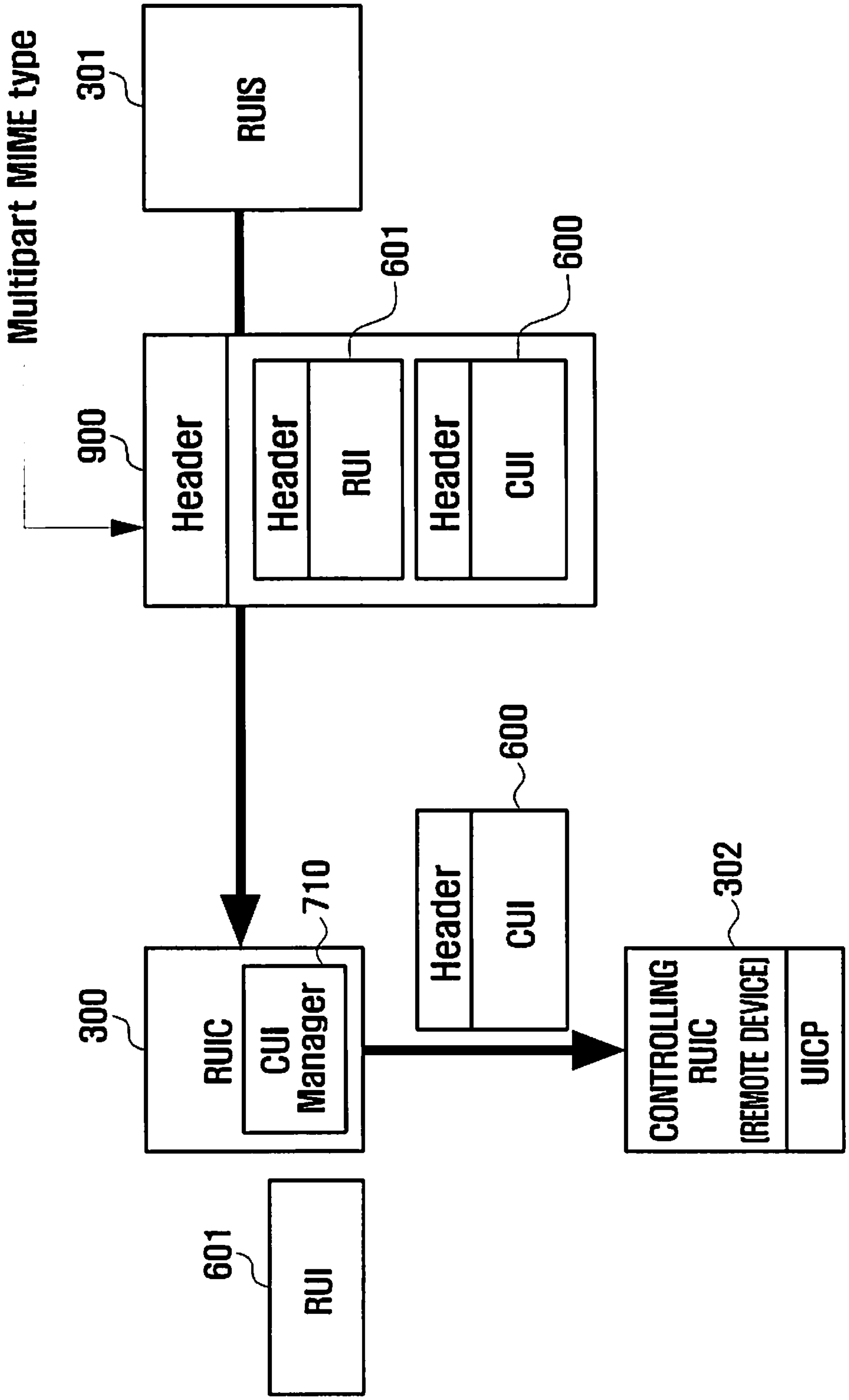
FIG. 9 illustrates a CUI transfer process in the remote user interface system according to another embodiment of the present invention.

FIGS. 8 and 9 illustrate how to transfer the CUI to the controlling RUIC. In the embodiments of FIGS. 8 and 9, the RUIS 301 provides both the RUI 601 and CUI 600. Unlike the embodiments of FIGS. 6 and 7 in which the control about the RUI 601 is not taken into account when transmitting the RUI 601 to the controlled RUIC 300, the RUIS 301 designates the CUI for the RUI 601, which it transmits in the embodiments of FIGS. 8 and 9.

FIG. 8 is a diagram illustrating a CUI transfer process in the remote user interface system according to another embodiment of the present invention.

Figure 18:
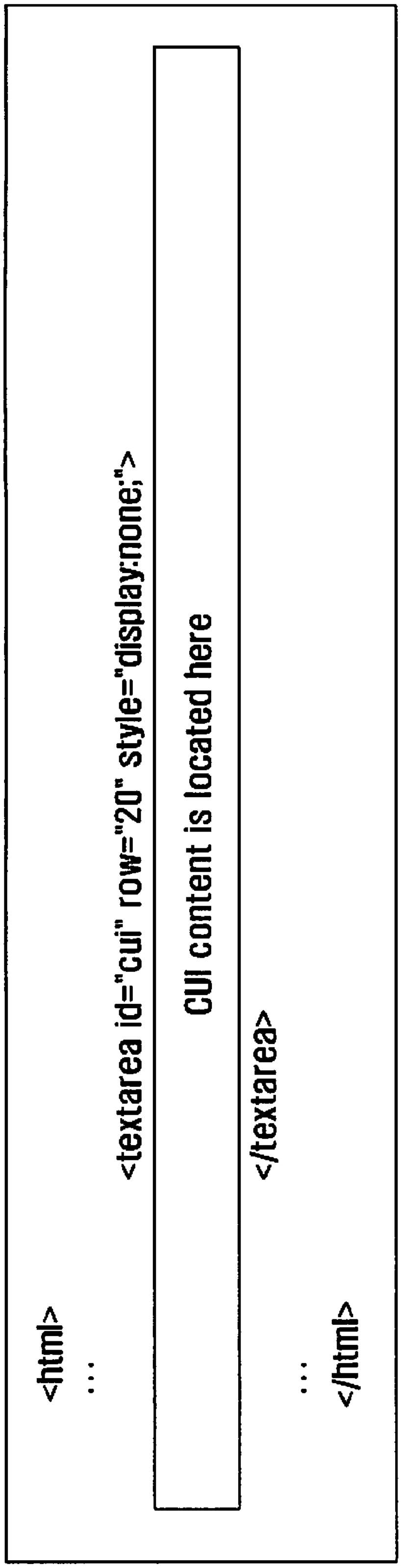
FIG. 18 is a table showing the structure of a control user interface (CUI) according to an embodiment of the present invention.

Referring to FIG. 8, the controlled RUIC 300 includes a CUI manager 710. The RUIS 301 transmits a UI package including the RUI 601 and the CUI 600 to the controlled RUIC 300. If the UI package has been received, the CUI manager 710 of the controlled RUIC 300 extracts the CUI 600 from the UI package and transmits the extracted CUI 600 to the controlling RUIC 302. The CUI 300 is structured as shown in FIG. 18.

FIG. 9 illustrates a CUI transfer process in the remote user interface system according to another embodiment of the present invention. In the embodiment of FIG. 9, the RUIS 301 provides the RUI and CUI to the controlled RUIC 300 in the form of a multipart MIME type.

Referring to FIG. 9, the RUIS 301 transmits a UI message including the RUI 601 and the CUI 600 to the controlled RUIC 300. The UI message is formatted in a multipart MIME type. The controlled RUIC 300 is provided with a CUI manager 710 such that the CUI manager 710 extracts the CUI 600 from the UI message and transmits the extracted CUI 600 to the controlling RUIC 302. The CUI transfer process in the embodiment of FIG. 9 is similar to that of FIG. 8 except that the RUI 601 and CUI 600 are transmitted as encapsulated in the Multipart MIME type.

FIG. 10 illustrates a CUI transfer process in the remote user interface system according to another embodiment of the present invention. In the embodiment of FIG. 10, the RUIS 301 transmits the RUI with a URL from which the CUI can be acquired.

Referring to FIG. 10, the RUIS 301 transmits the RUI 601 with a CUI URL 1002 to the controlled RUIC 300. The controlled RUIC 300 is provided with a CUI manager 710.

Figure 19:
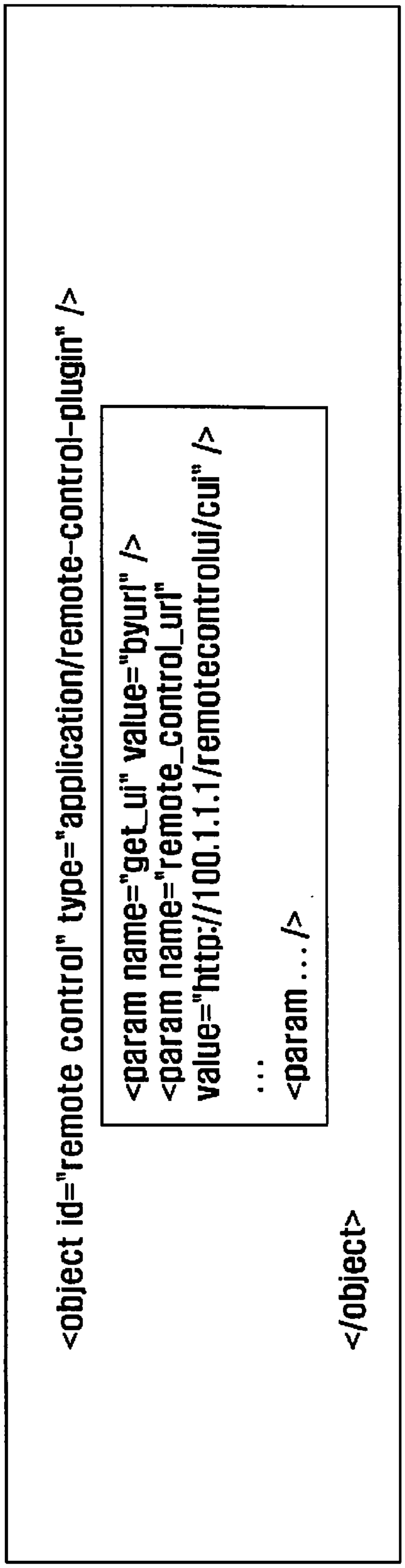
FIG. 19 is a table showing the structure of a CUI URL according to an embodiment of the present invention.

The CUI manager 710 extracts the CUI URL 1002 from the received RUI 601 and transmits the extracted CUI URL 1002 to the controlling RUIC 300. If the CUI URL 1002 has been received, the controlling RUIC 302 downloads the CUI 600 corresponding to the RUI 601 from the CUI URL 1002, i.e. the RUIS 301. The CUI URL is represented as shown in FIG. 19.

FIG. 11 illustrates a CUI transfer process in the RUI System according to another embodiment of the present invention. In the embodiment of FIG. 11, the controlling RUIC 302 downloads the CUI 600 from the RUIS 301 based on the information related to the RUI received via the controlled RUIC 300.

Referring to FIG. 11, the controlled RUIC 300 acquires the information related to the RUI through a Discovery and Capability Matching process with the RUIS 301. In the Discovery and Capability Matching process between the controlling RUIC 302 and the controlled RUIC 300, which is rendering the RUI, the controlling RUIC 302 can acquire the information 1102 on the RUI that is currently rendered by the controlled RUIC 300. The controlling RUIC 302 requests the RUIS 301 for the CUI 600 using the RUI-related information 1102, and the RUIS 301 transmit the requested RUI 600 to the controlling RUIC 302.

FIG. 12 illustrates a CUI transfer process in the remote user interface system according to another embodiment of the present invention. In the embodiment of FIG. 12, the controlling RUIC 302 downloads the CUI from the RUIS 301 directly without involvement of the controlled RUIC 300.

Referring to FIG. 12, the controlling RUIC 302 requests the RUIS 301 for the CUI, and the RUIS 301 transmits the requested CUI to the controlling RUIC 302. That is, the controlling RUIC 302 discovers the RUIS 301 and downloads the CUI 600 from the RUIS 301 directly without receiving any information from the controlled RUIC 300. The RUIS 301 stores the information about the controlled RUIC 300 and transmits a list of currently connected RUICs to the controlling RUIC 302 in response to the CUI request such that the controlling RUIC 302 selects an RUIC 300 from the list according to the user command. The controlling RUIC 302 transmits the information about the selected RUIC 300 to the RUIS 301, and the RUIS transmits the CUI 600 required for controlling the selected RUIC 300 to the controlling RUIC 302.

Figure 13:
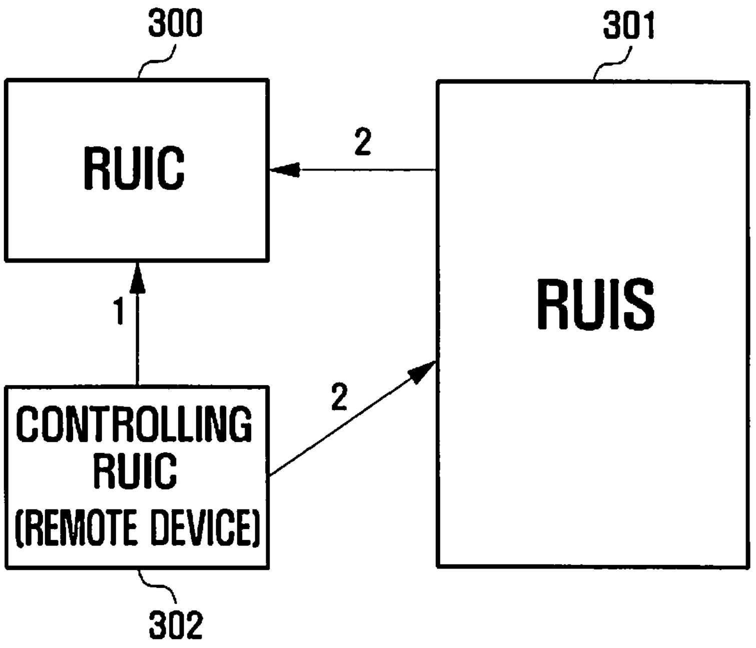
FIG. 13 illustrates operations of the RUIS and RUICs in the RUIC control process for the remote user interface system according to another embodiment of the present invention.

FIG. 13 is a diagram illustrating operations of the RUIS and RUICs in the RUIC control process for the remote user interface system according to an embodiment of the present invention. In FIG. 13, it is assumed that the controlling RUIC has received the CUI for controlling the controlled RUIC through any of the processes depicted in FIGS. 6 to 12.

Referring to FIG. 13, the controlling RUIC 302 controls the controlled RUIC 300 remotely according to a command input by the user. The controlling RUIC 302 can control the controlled RUIC 300 by transmitting the control command to the controlled RUIC 300 directly (see arrow 1 in FIG. 13) or transmitting the control command to the controlled RUIC 300 via the RUIS 301 (see arrows 2 in FIG. 13).

In the first method, the controlling RUIC 302 transmits a control message to the controlled RUIC 300 directly. The controlling RUIC 302 generates the control message, having control information in Hyper-Text Transfer Protocol (HTTP) format. In order to process the HTTP-formatted control message, the controlled RUIC 302 must support processing the HTTP message. In case the control command relates to controlling the unique features of the controlled RUIC 300, the controlled RUIC 300 must execute the control command for itself. In case that the control command relates to controlling the RUI received from the RUIS 301, the controlled RUIC 300 extracts the control information from the HTTP message and generates an event by means of an RUI renderer (not shown). The RUI renderer transmits the extracted control information to the RUIS 301 in the HTTP message format.

In the second method, the controlling RUIC 302 transmits an HTTP-formatted control message to a URL of the RUIS 301. The controlling RUIC 302 transmits to the RUIS 301 the control information and the control target information in the HTTP message format. If the HTTP-formatted control message is been received, the RUIS 301 analyzes the control information and control target information. In an analysis result, if it has been determined that the control target is the RUI, which is provided by the RUIS 301 and currently rendered in the controlled RUIC 300, the RUIS 301 processes the control information and requests the controlled RUIC 300 to update the RUI with the process result. If it has been determined that the control target is the unique feature of the controlled RUIC 300, the RUIS 301 transmits the control information to the controlled RUIC 300 by means of a notification message.

Figure 14:
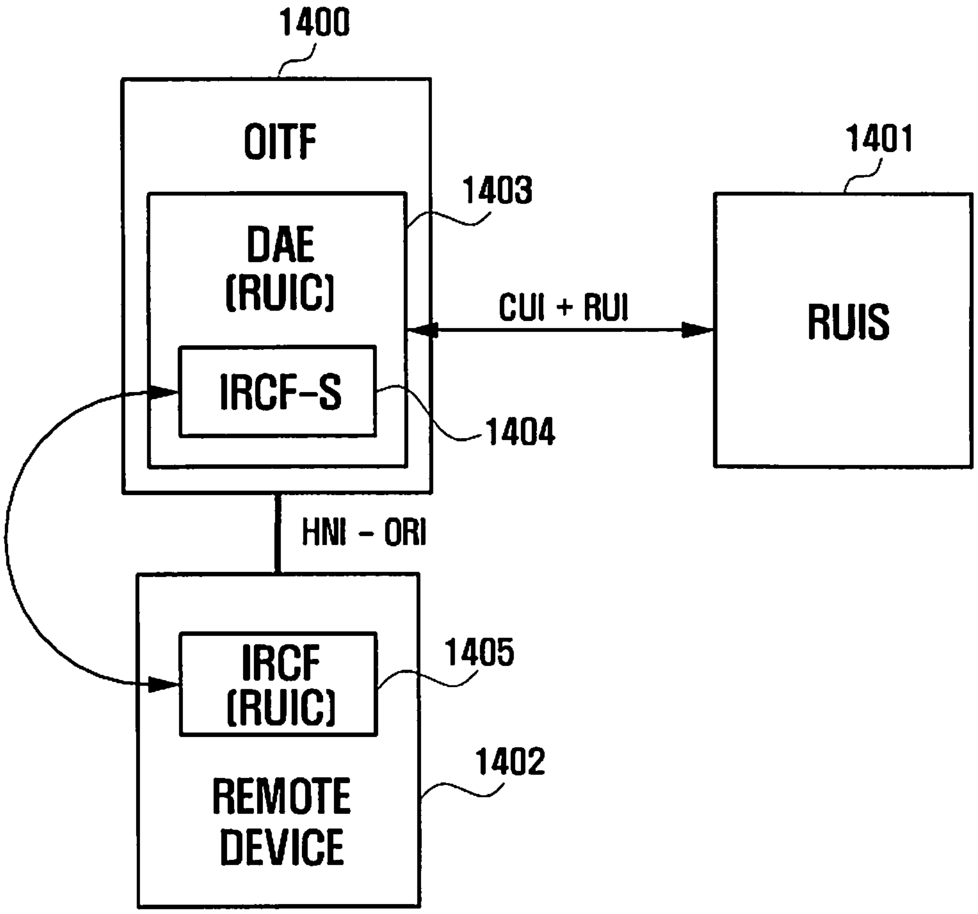
FIGS. 14 to 16 illustrates configurations of remote user interface systems according to embodiments of the present inventions.
Figure 15:
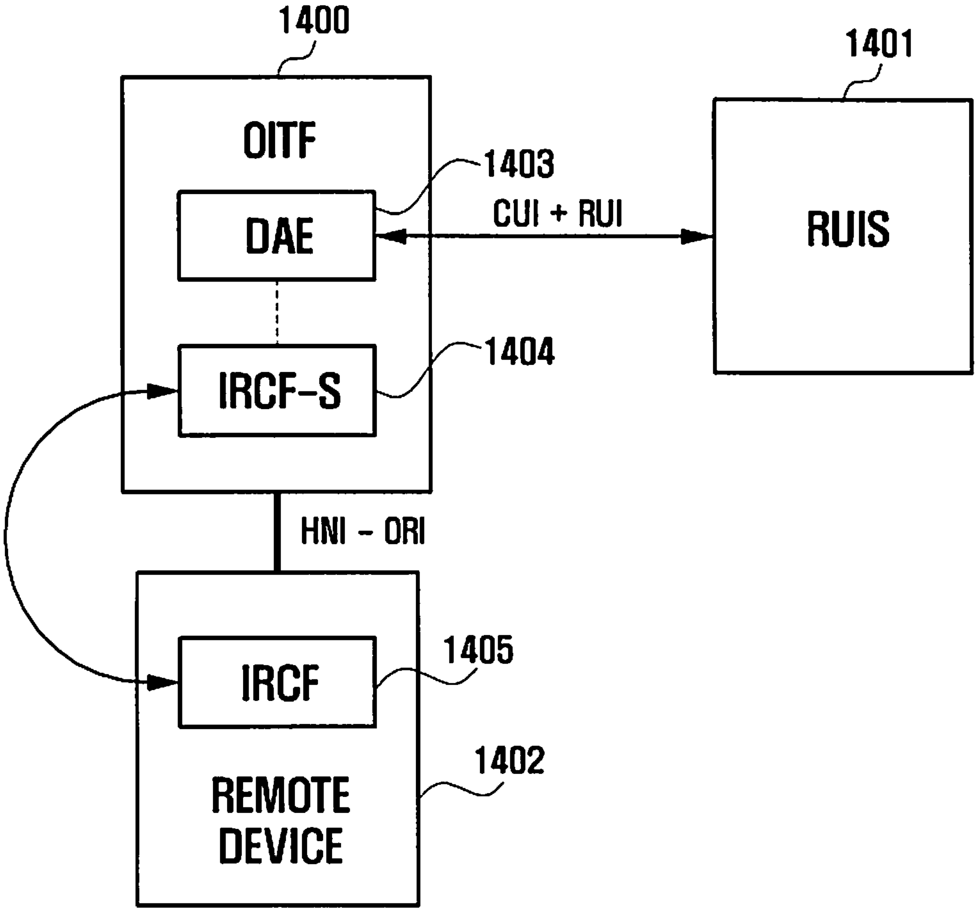
Figure 16:
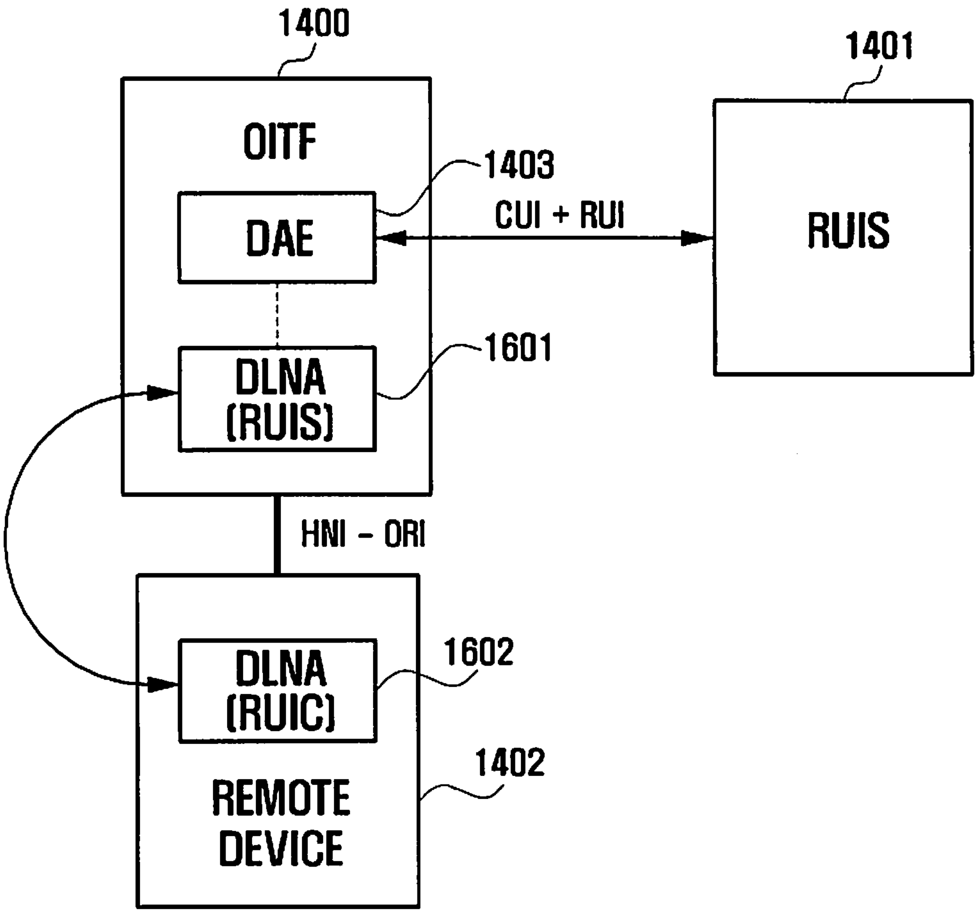

FIGS. 14 to 16 are diagrams illustrating configurations of remote user interface systems according to embodiments of the present inventions.

In the embodiment of FIG. 14, the remote user interface system includes an Open IPTV Terminal Function (OITF) device 1400, a remote device 1402, and an RUIS 1401. The OITF device includes a Declarative Application Environment (DAE) 1403 and an ITF Remote Control Function-Server (IRCF-S) 1404, and the IRCF-S 1404 is placed inside of the DAE 1403. This configuration of the OITF device can be applied to the Open IPTV Forum Architecture.

Referring to FIG. 14, the OITF device 1400 includes a DAE 1403, and the DAE 1403 includes an IRCF-S 1404. Also, the remote device 1402 includes an IRCF 1405. The IRCF 1405 and the IRCF-S 1404 have a discovery function, e.g. UPnP Discovery function, so as to discover each other. The IRCF-S provides a CUI in response to the request from the IRCF 1405, and the IRCF 1405 renders the CUI provided by the IRCF-S 1404 on its screen. In the discovery process between the OITF device 1400 and the remote device 1402, the remote device 1402 discovers the OITF devices by means of the IRCF 1405, or the OITF device 1400 discovers the remote device 1402. The OITF device 1400 can discover the remote device 1402 by means of the IRCF-S 1404, the DAE 1403, or a third entity, or can be discovered by the remote device 1402. As mentioned, the remote device 1402 can discover the OITF device 1400, and the OITF device can discover the remote device 1402. Here, the remote device 1402 can be a mobile phone or a portable device.

The RUIS 1401 transmits a message containing the CUI and/or RUI to the DAE 1403 of the OITF device 1400. The DAE 1403 extracts the CUI from the message transmitted by the RUIS 1401 and transfers the CUI to the IRCF-S 1404. Here, the CUI can be included in the RUI.

The remote device 1402 discovers the OITF device 1400 by means of the IRCF 1405. The IRCF 1405 can connect to the OITF terminal 1400 via a Home Network Interface OITF-Remote device Interface (HNI-ORI) interface. Once the OITF device 1400 has been found, the remote device 1402 performs capability matching with the OITF device 1400 and receives the CUI from the IRCF-S 1404. The remote device 1404 renders the received CUI on its display screen such that the user can control the OITF device 1400 while viewing the CUI. The CUI can be configured with a plurality of control buttons for the user to select. If the user selects a control button of the CUI, the remote device 1402 sends a control command corresponding to the selected control button to the IRCF-S 1404. Here, the control command can be transmitted, for example, in the form of an HTTP POST message, an HTTP GET message, an HTTP PUT message, etc.

As mentioned in the description with reference to FIG. 13, the IRCF-S 1404 checks whether the target of the control command is the OITF device 1400 or the RUI rendered in the DAE. If the target of the control command is the OITF device 1400, the IRCF-S 1404 executes the control command to control the OITF device 1400. If the target of the control command is the RUI, the IRCF-S 1404 transfers the control command to the DAE such that the DAE executes the control command.

In the embodiment of FIG. 15, the remote user interface system includes an Open IPTV Terminal Function (OITF) device 1400, a remote device 1402, and an RUIS 1401. The OITF device 1400 includes the IRCF-S 1404 and the DAE 1403, and the IRCF-S 1404 is placed outside of the DAE 1403. This structure of the OITF device can be applied to the Open IPTV Forum Architecture. The configuration of the OITF device 1400 of FIG. 15 is identical with that of FIG. 14 except that the IRCF-S is outside of the DAE 1403. The remote device 1402 includes an IRCF 1405. Here, the remote device 1402 can be a mobile phone or a portable device.

The remote user interface system of FIG. 15 operates in a similar manner to the remote user interface system of FIG. 14.

The RUIS 1401 transmits a message containing the RUI and the CUI to the DAE 1403 of the OITF device 1400. The DAE 1403 extracts the CUI from the message transmitted by the RUIS 1401 and transfers the extracted CUI to the IRCF-S 1404. Here, the CUI can be included in the RUI.

The remote device 1402 discovers the OITF device 1400 by means of the IRCF 1405. If the OITF device 1400 has been found, the remote device 1402 performs the capability matching process with the found remote device 1402 and receives the CUI from the IRCF-S of the OITF device 1403. The remote device renders and displays the CUI to the user such that the user can control the OITF device 1400 by manipulating the buttons of the remote device. If a control button is selected on the CUI, the remote device transmits a control command corresponding to the selected control button to the IRCF-S 1404. The control command can be transmitted in the form of an HTTP message.

If the control command has been received, the IRCF-S 1404 of the OITF device 1400 determines whether target of the control command is the OITF device 1400 or the RUI rendered in the DAE 1403. If the target of the control command is the OITF device 1400, the IRCF-S 1404 executes the control command to control the OITF device 1400. If the target of the control command is the RUI, the IRCF-S 1404 transfers the control command to the DAE 1403 such that the DAE 1403 executes the control command. Here, the DAE 1403 and the IRCF-S 1404 can communicate through a local script binding or local binding interface.

FIG. 16 is a diagram illustrating a configuration of a remote user interface system according to an embodiment of the present invention. In the embodiment of FIG. 16, a DLNA entity substitutes for the IRCF entity in the OITF device 1400. This configuration of the OITF device can be applied to the Open IPTV Forum Architecture.

The DLNA entity 1601 of the OITF device 1400 supports all the DLNA functions. That is, the DLNA entity 1601 can include the DLNA RUI function. The DLNA RUI allows the DLNA-enabled devices to support the RUI function based on the CEA-2014A Web-based Protocol and Framework for Remote User Interface on UPnP. First, the RUIS 1401 transmits the CUI and the RUI to the DAE 1403 of the OITF device 1400. The DAE 1403 transfers the CUI to the DLNA RUIS 1601.

The remote device 1402 can discover the DLNA RUIS 1601 of the OITF device 1400 by means of the DLNA RUIC 1602. The DLNA RUIC 1602 receives the CUI from the DLNA RUIS 1601. The CUI can be included in the RUI. The DLNA RUIC 1602 of the remote device 1402 renders and displays the CUI to the user such that the user can generate a control command to be transmitted to the DLNA RUIS 1601 using the CUI. If the control command has been received, the DLNA RUIS 1601 performs a control action according to the control command and target information. The DLNA RUIS 1601 checks the target of the control command. If the target of the control command is the OITF device 1400, the DLNA RUIS 1601 executes the control command to control the OITF device 1400. If the target of the control command is the RUI, the DLNA RUIS 1601 sends the control command to the DAE 1403 such that the DAE 1403 executes the control command to control the RUI. The DAE 1403 and the DLNA RUIS 1601 communicate through a local script binding or a local binding interface.

As mentioned, in an embodiment of the present invention, the RUIC is controlled by means of another RUIC as a remote device. The other RUIC functions as a remote control device and can be a mobile phone, and the controlled RUIC can be an OITF device such as an IPTV. In an embodiment of the present invention, the remote device discovers the OITF device and/or IP applications (device discovery), performs capability exchange and matching with the found OITF device, renders the CUI received from the OITF device, displays the rendered CUI to the user, and produces a control command according to the user input on the CUI.

Receiving the CUI from the OITF device includes receiving a default CUI, detecting a selection of content on the default CUI, and receiving a content CUI corresponding to the selected content. Here, the default CUI can be a UI for displaying a menu for controlling the OITF device, and the content CUI can be a UI for controlling the OITF device to process the content selected by the user.

Figure 17:
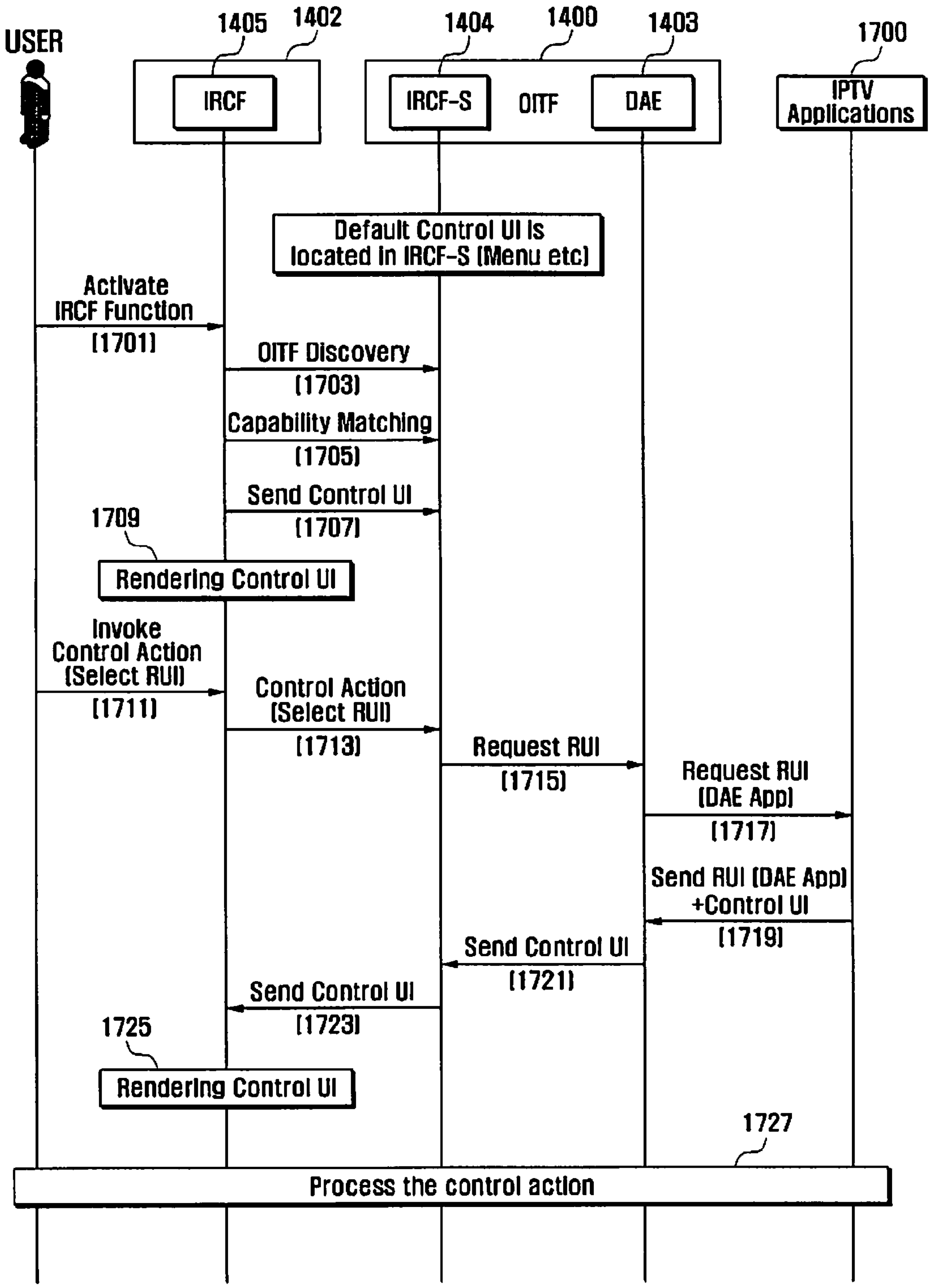
FIG. 17 illustrates operations of an ITF Remote Control Function-Server (IRCF), an Open IPTV Terminal Function (OITF) device, and IPTV applications entity for remote controlling in a remote user interface system according to an embodiment of the present invention.

FIG. 17 is a sequence diagram illustrating operations of an IRCF, an OITF device, and IPTV applications entity for remotely controlling in a remote user interface system according to an embodiment of the present invention.

In FIG. 17, the IRCF 1405 corresponds to the controlling RUIC 302 of FIGS. 3 to 13 and remote device 1402 of FIGS. 14 to 16, the OITF device 1400 corresponds to the controlled RUIC 300 of FIGS. 3 to 13 and the OITF device 1400 of FIGS. 14 to 16, and the IPTV applications entity 1700 corresponds to the RUIS 301 of FIGS. 3 to 13 and the RUIS 1401 of FIGS. 14 to 16. That is, the IRCF 1405 and DLNA RUIC 1602 correspond to the controlling RUIC 302, and the DAE 1403 corresponds to the controlled RUIC 300. Also, the IRCF-S 1404 and the DLNA RUIS 1601 corresponds to the CUI manager supporting the discovery function of the controlled RUIC 300. In an embodiment of the present invention, the CUI manager is placed within an OITF device rather than the RUIC device. In this case, the CUI manager can support the CUI for the IRCF-S and DLNA.

In FIG. 17, the IRCF 1405 can support the functions of the DLNA RUIC 1602 included in the remote device 1402 of FIG. 16, and the IRCF-S 1404 can supports the functions of the DLNA RUIS 1601 included in the OITF device 1400 of FIG. 16.

Referring to FIG. 17, the OITF device 1400 is controlled by means of a default CUI 1400. The default CUI can be provided by a CE vendor or a service provider. The default CUI includes a default menu for the user to configure the functions of the OITF device 1400, and the default menu allows selecting a specific content. The IRCF-S 1404 of the OITF device 1403 provides the default CUI.

If the user inputs an IRCF function activation command to the IRCF function of the remote device 1402, e.g., a mobile device or a portable device, the remote device 1402 receives the CUI and activates the IRCF function in step 1701. Once the IRCF function has been activated, the remote device 1402 and the OITF device 1400 perform discovery process in step 1703. The OITF device 1400 includes the DAE 1403 and the IRCF-S 1404, and the remote device 1402 includes the IRCF 1405. The IRCF 1405 and the IRCF-S support discovery function, e.g. UPnP discovery function, to discover each other. In the discovery process, the remote device 1402 can discover the OITF device 1400 by means of the IRCF 1405 or be discovered by the OITF device 1400. The OITF device 1400 can discover the remote device 1402 by means of the IRCF-S 1404, DAE 1403, or another entity, or be discovered by the remote device 1402.

In FIG. 17, the IRCF 1405 of the remote device 1402 discovers the OITF device 1400 at step S1703. In this case, the remote device 1402 can broadcast a discovery message containing target information in search of the OITF device 1400. In the case of using the UPnP discovery message, the UPnP discovery message includes the target information in the Search Target (ST) field. If a response message is received from the OITF device 1400, the remote device 1402 analyzes the device description on the OITF device 1400 to prepare for the capability matching process.

Next, the remote device 1402 performs capability exchange and matching process with the OITF device 1400 in step 1705.

After completing the capability exchange and matching process, the OITF device 1400 transmits a CUI to the remote device 1402 in step 1707, and the remote device 1402 renders the CUI received from the OITF device 1400 and displays the rendered CUI on its display screen in step 1709. The IRCF 1405 of the remote device 1402 receives a default CUI from the IRCF-S 1404 and renders the default CUI such that the remote device 1402 displays the default CUI to the user. Here, the default CUI can be a CUI for the user to select an RUI.

The user can select one of basic functions on the default CUI. That is, the remote device 1402 displays the default CUI on its display screen such that the user can select certain content on the default CUI. If the user invokes a control action, e.g. selects certain content in step 1711, the remote device 1402 checks the information on the selected content and sends the control action, i.e., RUI request for the selected content, to the IRCF-S 1404 of the OITF device 1400 in step 1713. If the control action is received, the IRCF-S 1404 sends a content request to the DAE 1403 in step 1415 and, thus, the DAE 1403 sends a request to the IPTV applications entity 1700 for the content in step 1417. That is, the RUI requests that the selected content be delivered to the DAE 1403 via the IRCF-S 1404, and the DAE 1403 requests that the IPTV applications entity 1700 for the RUI of the DAE application selected by the user.

If the content request is received, the IPTV applications entity 1700 sends the DAE application the content required for rendering and the CUI required for controlling the DAE application to the OITF device 1400 in steps 1719 and 1721, and the OITF device 1400 sends the CUI to the remote device 1402 in step 1723. In more detail, the IPTV applications entity 1700 sends the DAE application and the CUI for controlling the DAE application to the DAE 1403 at step 1719, and the DAE 1403 renders the DAE application on the display screen and sends the CUI to the IRCF-S 1404 at step 1721. If the CUI is received, the IRCF 1405 of the remote device 1402 renders the CUI such that the rendered CUI is presented on the display of the remote device 1402 in step 1725. The CUI can be provided with an input screen (including any or all of a plurality of alphanumeric keys, playback control keys (fast forward, rewind, play, pause, and stop keys), navigation keys, and function execution icons). The CUI can be configured as an input screen optimized for controlling the playback of the content. If the user selects a key or icon on the CUI, the remote device 1402 sends a control command corresponding to the selected key or icon to the OITF device 1400, whereby the OITF device operates under the control of the remote device 1402 in step 1727.

As described above, the remote user interface system and method of the present invention is capable of providing a controlling RUIC with device-specific, RUI-specific, or user specific CUI for controlling a playback of a content and an RUI corresponding to the content that is rendered in a controlled RUIC. Also, the remote user interface system and method of the present invention is capable of providing the user with the CUI-specific, RUI-specific, content-specific, and user-specific supplementary by means of a remote control device.

Although embodiments of the present invention have been described in detail above, it should be clearly understood that many variations and/or modifications of the basic inventive concepts herein taught which may appear to those skilled in the present art will still fall within the spirit and scope of the present invention, as defined in the appended claims.

What is claimed is:

1. A method for controlling an Open Internet protocol television Terminal Function (OITF) device with a remote control device, the method comprising;
- discovering by the remote control device, the OITF device;
- performing, by the remote control device, a capability matching with the OITF device;
- receiving a first control user interface;
- rendering the first control user interface transmitted
- transmitting, when a control action is invoked by a user, a request corresponding to the control action to the OITF device;
- receiving a second control user interface;
- rendering the second control user interface; and
- transmitting, when an input is detected on the second control user interface, a message corresponding to the input to the OITF device.

2. A method for controlling a providing a user interface by an Open Internet protocol television Terminal Function (OITF) device to a remote control device, the method comprising:
- performing capability matching with the remote control device;
- transmitting, by the OITF device, a first control user interface to the remote control device;
- receiving a request corresponding to a control action from the remote control device, when the control action is invoked by a user;
- transmitting, by the OITF device, a content request to an Internet Protocol Television (IPTV) application entity;
- receiving the requested content and a second control user interface from the IPTV application entity;
- rendering the requested content; and
- transmitting the second control user interface to the remote control device.

3. The method of claim 2, wherein the OITF device comprises:

a Declarative Application Environment (DAE) and a Remote User Interface Server (RUIS), and the RUIS transmits the second control user interface to the remote control device.

4. The method of claim 1, wherein the OITF device comprises: a Remote User Interface Server (RUIS), the remote control device comprises: a Remote User Interface Client (RUIC), and the RUIC receives the second control user interface transmitted by the RUIS and renders the second control user interface.

5. The method of claim 1, wherein the remote control device receives, if the control action is for selecting a content, the second control user interface from an Internet Protocol Television (IPTV) application entity through the OITF device for controlling playback of the content.

6. A remote control device for controlling an Open Internet protocol television Terminal Function (OITF) device, comprising:

a Remote User Interface Client (RUIC) adapted to perform the following steps:

discovering the OITF device; performing a capability matching with the OITF device;

receiving a first control user interface; rendering the first control user interface;

transmitting, when a control action is invoked by a user, a request corresponding to the control action to the OITF device;

receiving a second control user interface;

rendering the second control user interface; and transmitting, when an input is detected on the second control user interface, a message corresponding to the input to the OITF device.

7. The remote control device of claim 6, wherein the OITF device comprises a Remote User Interface Server (RUIS), and the RUIC receives the second control user interface transmitted by the RUIS and renders the second control user interface.

8. The remote control device of claim 7, wherein the RUIC receives, if the control action is for selecting a content, the second control user interface from an Internet Protocol Television (IPTV) application entity through the OITF device for controlling playback of the content.

9. An Open Internet protocol television Terminal Function (OITF) device comprising:

a Remote User Interface Server (RUIS) for performing capability matching with a remote control device, for transmitting a first control user interface to the remote control device, and for receiving a request corresponding to a control action from the remote control device, when the control action is invoked by a user; and a Declarative Application Environment (DAE) for transmitting a content request to an Internet Protocol Television (IPTV) application entity, if the control action is for selecting a content, for receiving the requested content and a second control user interface from the IPTV application entity, for rendering the requested content, and for transmitting the second control user interface to the remote control device through the RUIS.

* * * * *

UNITED STATES PATENT AND TRADEMARK OFFICE

CERTIFICATE OF CORRECTION

PATENT NO. : 8,441,369 B2
APPLICATION NO. : 12/712796
DATED : May 14, 2013
INVENTOR(S) : Ho Yeon Park et al.

It is certified that error appears in the above-identified patent and that said Letters Patent is hereby corrected as shown below:

On the Title page, Item (75) Inventors:

“Young Sin Ryu” should be -- Young Sun Ryu --

Signed and Sealed this
Twenty-eighth Day of January, 2014

Michelle K. Lee
*Deputy Director of the United States Patent and Trademark Office*